United States Patent [19]
Williams

[11] Patent Number: 5,243,212
[45] Date of Patent: Sep. 7, 1993

[54] TRANSISTOR WITH A CHARGE INDUCED DRAIN EXTENSION

[75] Inventor: Richard K. Williams, Cupertino, Calif.

[73] Assignee: Siliconix incorporated, Santa Clara, Calif.

[21] Appl. No.: 802,352

[22] Filed: Dec. 4, 1991

Related U.S. Application Data

[60] Division of Ser. No. 451,518, Dec. 15, 1989, Pat. No. 5,108,940, which is a continuation-in-part of Ser. No. 136,403, Dec. 22, 1987, abandoned.

[51] Int. Cl.$^5$ .................. H01L 29/76; H01L 29/94; H01L 29/167
[52] U.S. Cl. .................. 257/344; 257/408; 257/409; 257/607
[58] Field of Search .................. 357/23.3, 23.8, 23.15; 257/344, 408, 607, 409

[56] References Cited

U.S. PATENT DOCUMENTS

| | | | |
|---|---|---|---|
| 3,328,210 | 6/1967 | McCaldin | 357/23.15 |
| 3,442,721 | 5/1969 | McCaldin et al. | 357/23.15 |
| 3,607,449 | 9/1971 | Tokuyama et al. | 148/1.5 |
| 3,657,614 | 4/1972 | Cricchi | 357/45 |
| 3,956,025 | 5/1976 | Statz et al. | 148/1.5 |
| 3,972,059 | 7/1976 | DiStefano | 357/6 |
| 3,983,574 | 9/1976 | Statz | 357/23.15 |
| 4,043,024 | 8/1977 | Iwamatsu | 29/571 |
| 4,047,974 | 9/1977 | Harari | 148/1.5 |
| 4,048,350 | 9/1977 | Glang et al. | 427/93 |
| 4,258,077 | 3/1981 | Mori et al. | 427/38 |
| 4,306,352 | 12/1981 | Schrader | 29/571 |
| 4,391,032 | 7/1983 | Schulte | 29/571 |
| 4,468,574 | 8/1984 | Engeler et al. | 307/451 |
| 4,714,519 | 12/1987 | Pfiester | 437/44 |
| 4,764,477 | 8/1988 | Chang et al. | 437/44 |
| 4,994,869 | 2/1991 | Matloubian et al. | 437/44 |
| 5,047,361 | 9/1991 | Matloubian et al. | 357/23.3 |
| 5,055,896 | 10/1991 | Williams et al. | 357/23.8 |
| 5,108,940 | 4/1992 | Williams | 357/23.3 |

FOREIGN PATENT DOCUMENTS

| | | | |
|---|---|---|---|
| 2064-267 | 5/1977 | Japan | 437/37 |
| 58-169975 | 10/1983 | Japan | 357/23.15 |
| 1-179363 | 7/1989 | Japan | 357/23.3 |
| 2-262358 | 10/1990 | Japan | 357/23.15 |
| 2028582A | 3/1980 | United Kingdom | 357/23.15 |

OTHER PUBLICATIONS

*IEEE.* Electron Device Letters, vol. 11, No. 1, Jan. 1990, "Improved Hot-Carrier Resistance with fluorinated gate-oxides" by MacWilliams et al., pp. 3-5.
Demoulin et al. "Process Statistics of Submicron MOSFETs" *IEEE* (1979) pp. 34-37.
Takeda et al., "Device Performance Degradation Due to Hot-Carrier Injection at Energies Below the Si-SiO$_2$ Energy Barrier," *IEEE* (1983), pp. 396-399.
Ogura et al. "Elimination of Hot Electron Gate Current by the Lightly Doped Drain-Source Structure," *IEEE*, (1981), pp. 651-654.
Nakahara et al., "Relief of Hot Carrier Constraint on Submicron CMOS Services by Use of a Buried Channel Structure," *IEEE* (1985) pp. 238-241.
Yamaguchi, "Process and Device Design of a 1000-Volt MOS IC," *IEEE* (1981) pp. 255-258.

(List continued on next page.)

*Primary Examiner*—Rolf Hille
*Assistant Examiner*—Steven Loke
*Attorney, Agent, or Firm*—Skjerven, Morrill, MacPherson, Franklin & Friel

[57] ABSTRACT

A product is taught which provides very shallow conductive regions in a semiconductor material by the formation of a fixed charge placed in an overlying dielectric layer which induces an inversion region in the underlying semiconductor. The inversion region so formed is used as a MOSFET drain extension between a drain contact region and the channel located beneath the gate region. The conductivity of the induced inversion region is controlled by the concentration of the ionic charge present in the dielectric layer.

30 Claims, 6 Drawing Sheets

OTHER PUBLICATIONS

Stupp et al., "Low Specific On-Resistance 400V LDMOST", *IEEE* (1981) pp. 426–428.

Snow et al., "Ion Transport Phemomena in Insulating Films," *J. Appl. Phys.*, (19) 36:1664–1673.

Hino et al., "Neutralization of Mobile Ions in the $SiO_2$ Film of MOS Structures" *J. Appl. Phys.*, (1979), 50:4879–4882.

Eitan et al., "Surface Conduction in Short-Channel MOS Devices as a Limitation to VLSI Scaling," *IEEE* (1982), 29:254–266.

Dennard et al., "Design of Ion-Implanted MOSFETs with Very Small Physical Dimensions," *IEEE* (1974), 9:256–268.

Merckel, "A Simple Model of the Threshold Voltage of Short and Narrow Channel MOSFETs," *Solid State Electronics*, (1980) 23:1707–1213.

Yau, "A Simple Theory to Predict the Threshold Voltage of Short-Channel IGFETs" *Solid State Electronics* (1974) 17:1059–1063.

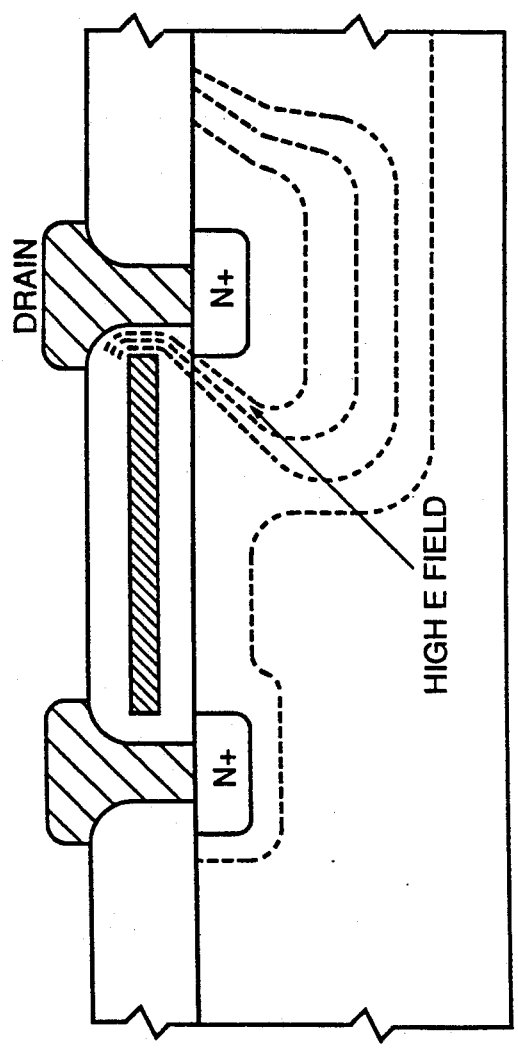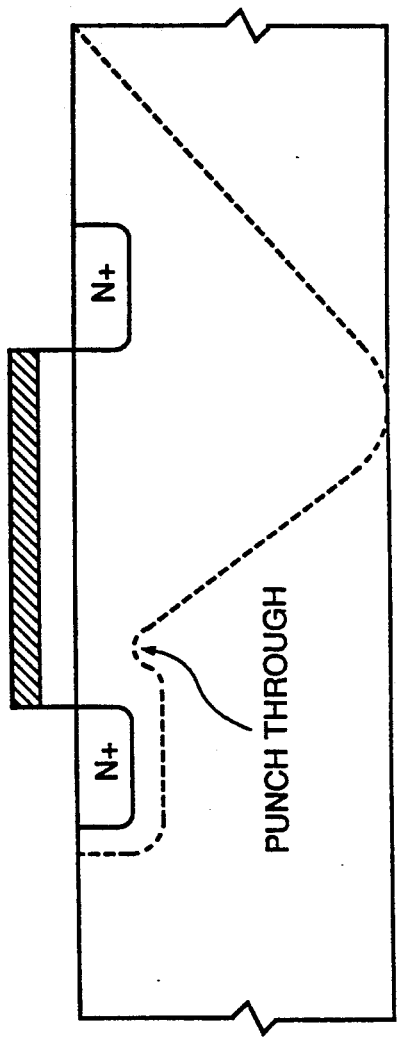
FIG. 1 (PRIOR ART)
FIG. 2 (PRIOR ART)

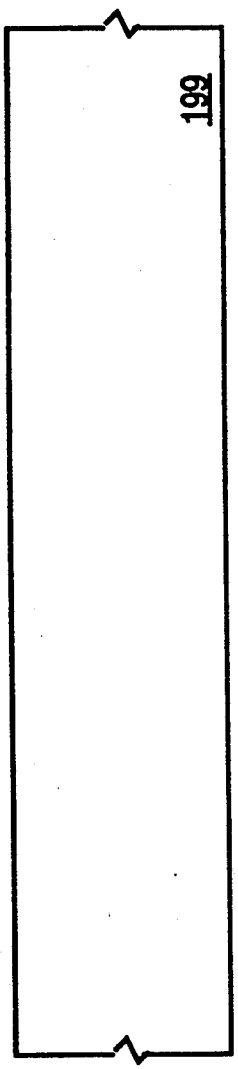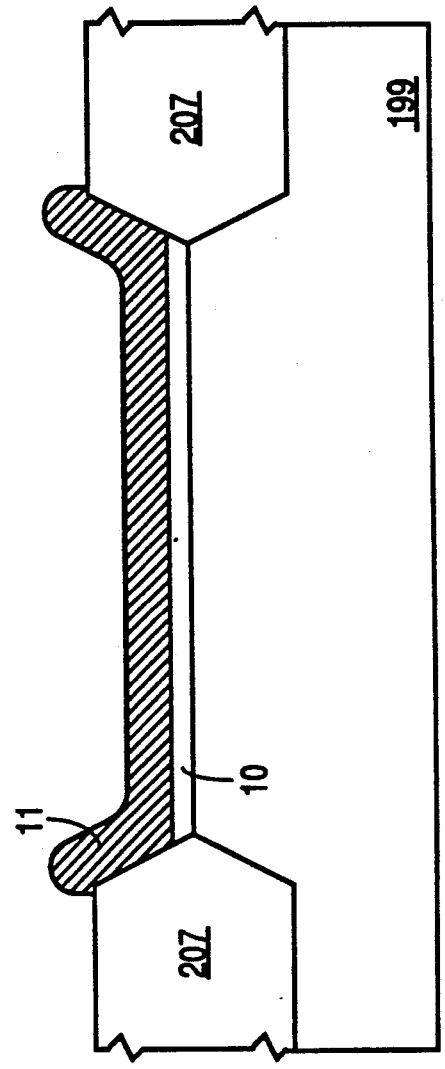
FIG. 5a
FIG. 5b

TRANSISTOR WITH A CHARGE INDUCED DRAIN EXTENSION

CROSS REFERENCE TO RELATED APPLICATIONS

This application is a division of U.S. Application Ser. No. 07/451,518, filed Dec. 15, 1989, now U.S. Pat. No. 5,108,940, which is a continuation-in-part of U.S. Application Ser. No. 07/136,403, filed Dec. 22, 1989, now abandoned.

BACKGROUND OF THE INVENTION

This invention pertains to Metal Oxide Silicon Field Effect Transistors (MOSFETs), and more particularly to MOSFETs which include a drain extension region which is charge-induced.

In either very short channel MOSFETs or in high voltage MOSFETs, a significant portion of the reverse biased drain-to-body junction depletion spreading and a high electric field are present under the transistor's gate region as shown in FIG. 1. Such conditions lead to premature breakdown due to fieldplate induced avalanche, as shown in FIG. 1, or punch-through, as shown in FIG. 2 and described in Demoulin, E. et al., "Process Statistics of Submicron MOSFETs," IEDM 1979, paper 2.7, pp. 34-37. The high electric fields also lead to the formation and trapping of hot carriers in the gate oxide, as described in Takeda, E. et al., "Device Performance Degradation Due to Hot-Carrier Injection at Energies Below the Si-SiO$_2$ Barrier,"0 IEDM 1979, paper 15.5, pp. 396-399, and their associated reliability problems due to shifts int he threshold voltage. In short channel devices, charge sharing between the gate capacitor and drain-to-body junction causes a channel-length-dependent lowering of the threshold voltage as described in Shibata, T. et al., "An Optimally Designed Process for Submicron MOSFETs" IEDM 1981, pp. 647-650.

To alleviate these and related problems such as high gate-to-drain overlap capacitance, the lightly-doped-drain (LDD) MOSFET is used, as described in Ogura, S. et al., "Elimination of Hot Electron Gate Current by the Lightly Doped Drain-Source Structure," IEDM 1981, pp. 651-654. Shown in FIG. 3, LDD MOSFET 100 employs conventional heavily doped source region 101 and drain region 102 offset from polycrystalline silicon or silicide gate electrode 105 by sidewall oxide spacer 106 to which N+implants used to form source regions 101 and drain region 102 are self aligned. Such an arrangement is shown in Nakahara, M. et al., "Relief of Hot Carrier Constraint on Submicron CMOS Devices by Use of a Buried Channel Structure," IEDM 1985, pp. 238-240. Sidewall oxide spacer 106 overlays lightly doped N- source extension 103 and drain extension 104, which are created by ion implantation after formation of field oxidation 107 and gate electrode 105 but prior to formation of sidewall oxide spacer 106. Since feature sizes are small (typically around 1 μm) the light ion implantation extensions and oxide spacer appears on both the drain and source side of the transistor, despite the fact that it is called a lightly-doped-drain transistor.

Lightly doped source/drain regions 103, 104 serve a number of functions. First, either one of the source/-drain regions 103, 104 can, depending upon the circuit configuration, become reversed biased to body region 100, thereby serving as the drain of the device. The drain-body junction behaves as a two-sided junction in which depletion occurs on both sides of the junction, i.e. into both the drain and the body regions, reducing the amount of depletion spreading under gate electrode 105 and into channel 109. This reduction of depletion spreading under gate electrode 105 into channel 109 occurs due to the depletion spreading in the lightly doped drain region, which causes a voltage drop in the lightly doped drain. This means the amount of the source-to-drain voltage which must be sustained across the channel is reduced, thereby allowing the channel length to be decreased, and the gate oxide made thinner. Second, the lightly doped source and drain extensions 103, 104 decrease the amount of hot carriers injected into gate electrode 105, thereby avoiding charge induced degradation of the transconductance (gm) of transistor 100. Lightly doped source and drain extensions 103, 104 also reduce the amount of charge sharing between the depletion region associated with the gate and the depletion region associated with the reverse biased drain-to-body diode, thus reducing channel length dependent variations of the threshold voltage of transistor 100. Extensions 103, 104 also decrease the capacitance caused by the overlap of gate 105 to the N+source and drain diffusions 101, 102 and therefore increase the speed of transistor operation via a reduced Miller effect. The Miller effect, common to all MOSFETs, is the increase in input capacitance of a gain stage by a factor of Av*$C_{gd}$, where Av is the voltage gain of the stage, and $C_{gd}$ is the gate-to-drain capacitance, in a conventional MOSFET the capacitance caused by the overlap of gate 105 to source and drain diffusions 101, 102. Naturally, in a MOSFET using a lightly doped drain region, $C_{gd}$ is the gate-to-drain overlap capacitance caused by the overlap of gate 105 to lightly doped source and drain extensions 103, 104, which is less than the $C_{gd}$ of a conventional MOSFET.

Lightly doped drains are used in prior art high voltage devices in order to achieve low on-resistances and high off-state blocking voltages. The technique called lateral charge control (LCC) as described in Yamaguchi, T. et al., "Process and Device Design of a 1000-Volt MOS IC," IEDM 1981, pp. 255-258, and the related technique called "reduced surface fields" (RESURF) as described in Stupp, E. et al., "Low Specific On-resistance 400V LDMOST," IEDM 1981, pp 426-428, use a drain extension which depletes when reverse biased and has been demonstrated as an effective termination (i.e. area outside of the diode which allows the radius of curvature of the diode junction to be overcome, thereby spreading out the field lines creating a lower electrical field) to over 1,000 volts. Since the feature sizes in high voltage devices are larger than those used in VLSI transistors, the lightly doped region is normally created using implant blocking masks so that a sidewall oxide spacer is not needed. In this event, the lightly doped regions are conveniently formed on only the drain side of the device.

As devices have been scaled to even smaller dimensions, the need to fabricate very shallow junctions has become increasingly important in eliminating the lateral diffusion of source and drain regions under the gate. New process techniques such as the use of slowly diffusing dopants (e.g., arsenic), shallow implants (e.g. BF$_2$) and rapid thermal anneals of implants have been used, but often complicate or restrict the process by requiring these steps to be performed at low temperatures or for short periods of time. In high voltage transistors where a double-diffused "body" region is employed, the extra body diffusion will change the drift region dopant profile considerably unless it can be integrated into the process after the body diffusion.

Using conventional diffusion techniques as described above, the shallow lightly doped drain is achieved at the expense of a loss in flexibility in the integrated process design. In cases when extremely shallow junctions are needed for high frequency or VLSI (submicron) transistors, the process may be considerably more complex than desirable. In some cases, the desired junction depth may be physically impossible using today's technology.

SUMMARY OF THE INVENTION

In accordance with the teachings of this invention, a process is taught which provides very shallow conductive regions in a semiconductor material by the formation of a fixed charge placed in an overlying oxide layer which induces an inversion region in the underlying semiconductor. The inversion region so formed is, in one embodiment, used as a MOSFET drain extension between a drain contact region and the channel located beneath the gate region. Furthermore, in accordance with this invention, the conductivity of the induced inversion region is controlled by the concentration of the ionic charge present in the oxide layer, thus allowing the drain extension to be lightly doped, if desired. If desired, the charge is placed in the gate dielectric layer overlying the drain extension; alternatively this charge is placed in a dielectric layer which replaces the gate dielectric layer above the drain extension region or in a dielectric layer overlying the gate dielectric layer above the drain extension. In an alternative embodiment, this charge is placed in the sidewall spacer dielectric adjacent the gate electrode. If desired, a permanent or temporary layer of capping material is used to prevent the charge from migrating out of the dielectric layer in which it is placed, during subsequent heat treatment steps during the fabrication of the device.

BRIEF DESCRIPTION OF THE DRAWINGS

FIG. 1 is a cross-sectional view of a prior art MOSFET device depicting depletion spreading and electric field when the drain is reverse-biased to the body.

FIG. 2 is a cross-sectional view of a prior art MOSFET depicting punchthrough.

FIGS. 5a through 5f are cross-sectional views depicting one example of a process sequence of this invention.

DETAILED DESCRIPTION

Figure 3:
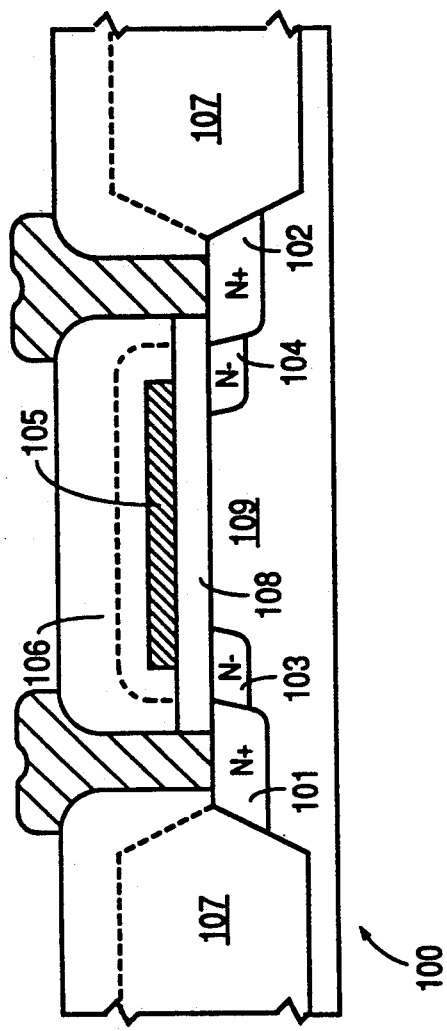
FIG. 3 is a cross-sectional view of a typical prior art lightly doped drain MOSFET.
Figure 4:
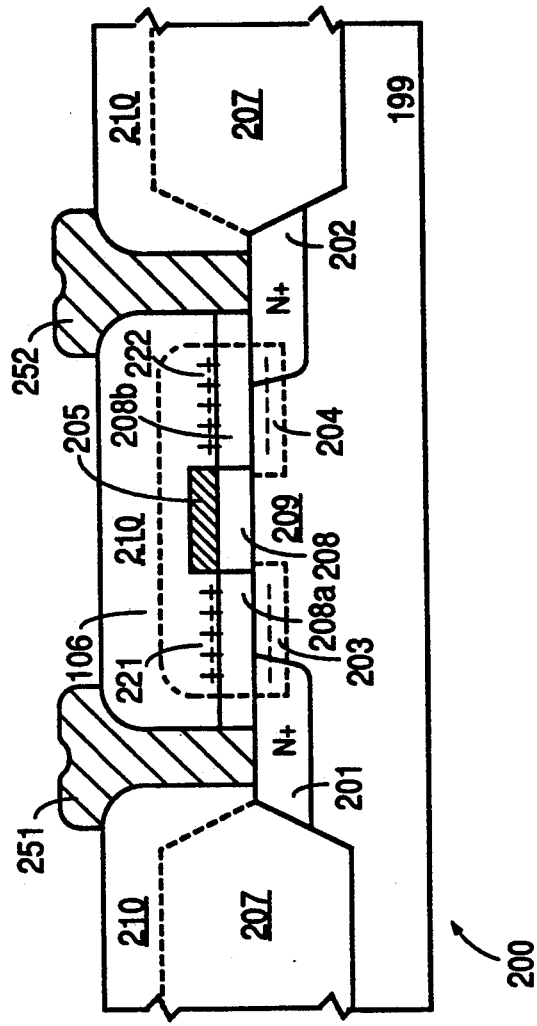
FIG. 4 is a cross-sectional view of one embodiment of a lightly-doped drain MOSFET constructed in accordance with the teachings of this invention.

FIG. 4 illustrates one embodiment of a short-channel MOS transistor 200 constructed in accordance with the teachings of this invention. In FIG. 4, transistor 200 includes lightly doped drain (LDD) extension 204, as well as lightly doped source extension 203, which are induced by charges 222, 221, respectively, placed in oxide layer 208, which in the embodiment shown in FIG. 4 comprises the gate dielectric layer. In an alternative embodiment, the gate dielectric layer overlying the to be formed source and drain extensions 203 and 204 are removed and a new dielectric layer formed in their place, which then receives the charges 221 and 222. In an alternative embodiment of this invention, regardless of whether a gate dielectric 208 is replaced above the source and drain extension 203 and 204, an additional dielectric layer is formed above dielectric layer 208, with this additional dielectric layer being the repository of the charge used to produce the source and drain extensions 203 and 204. For example, as shown in FIG. 4, oxide layer 210 or sidewall spacer dielectric 206 adjacent gate electrode 205 are suitable repositories for the charges used to induce the source and drain extensions 203 and 204. Alternatively, an additional dielectric layer (not shown) is formed for holding the charge with this additional layer being formed above gate dielectric layer 208 and beneath oxide layer 210. It is understood that the charge, after thermal processing during subsequent fabrication steps, may reside in the interface between the semiconductor material and the dielectric layer.

Transistor 200 is composed of a starting material substrate 199 of a first conductivity type (in this example, P type) in which source 201 and drain 202 are diffused regions of a second conductivity type (in this example, N type) which extend from upper surface 198 into substrate 199. Gate dielectric layer 208 is located on upper surface 198 and extends between source region 201 and drain region 202. Conductive gate electrode 205 is located on gate dielectric layer 208 extending from slightly beyond source region 201 to slightly before drain region 202, thereby providing no vertical overlap from either source 201 or drain 202 to gate electrode 205. Portions 208a and 208b of gate dielectric layer 208 located between source 201 and drain 202 not covered by gate electrode 205 contain charges 221 and 222, respectively. In one embodiment, charges 221, 222 are provided by charged dopants, which may be conveniently placed in oxide layers 208a, 208b, for example by ion implantation. In one embodiment, such charges dopants are Group I or II elements, which are prone to giving up an electron, even when the dopant is present in an insulator. Such elements were previously taught to be a curse in the manufacture of semiconductor devices, as it is well known that sodium contamination tends to intolerably alter threshold voltages. When group I or group II elements are used, their charge is positive in the dielectric, and they induce N-type source and drain extensions in the semiconductor material.

In one embodiment, cesium is used as the dopant, since cesium has a tendency to remain immobile once introduced into an insulator. The concentration of charges 221, 222 is sufficient to invert portions 203, 204 of semiconductor substrate 199 beneath oxide regions 208a, 208b, respectively, from conductivity of the first type into conductivity of the second type.

In an alternative embodiment, the charged dopants comprise group VI or group VII elements which are prone to accepting an electron, even when the dopant is present in an insulator. Fluorine and iodine are suitable group VII elements as they remain relatively immobile once introduced into an insulator. Group VI and group VII elements serve to provide negative charge in the dielectric, thereby inducing P-type source and drain extensions in the semiconductor.

Charge-induced inversion regions 203, 204 serve as source and drain extensions, respectively, thereby establishing the length $L_{CH}$ of channel 209. Since the charge in oxide regions 208a, 208b induces a very shallow (typically less than 100Å) inversion region in semiconductor substrate 199, the dimension $L_G$ of gate electrode 205 does not require additional length to compensate for lateral diffusion of source and drain extensions 203, 204 to achieve a desired channel length $L_{CH}$. Preferably, the dopant concentration of source and drain extensions 203, 204 is within the range of approximately $10^{12}$ to $10^{18}$ atoms/cm$^3$, which may be achieved with charge 221, 222 concentrations within approximately the same range. The concentration of oxide charges 221, 222 is chosen to minimize the dopant concentration of source and drain extensions 203, 204, thus reducing depletion spreading into channel 209, and thereby allowing a shorter gate length $L_G$ to avoid punchthrough breakdown. Since the induced junctions of extensions 203 and 204 are very shallow, the gate to drain overlap capacitance is minimized allowing for high speed operation due to a reduced "Miller effect".

If desired, a layer of capping material (not shown) is formed over the dielectric layer which holds the charged dopants, in order to prevent the charged dopants from migrating out of the dielectric layer during subsequent heat treatment steps of the fabrication process. This layer of capping material can comprise, for example, suitable dielectrics or polycrystalline silicon. The layer of capping material can be permanent, remaining in the finished device, or temporary, in which case it is removed later during the fabrication process. If desired, the capping layer can serve other functions as well elsewhere in the integrated circuit and, if desired, may be patterned such that only part of the capping layer is present in the finished device or during subsequent heat treatment steps.

Fabrication in accordance with the teachings of this invention of one embodiment of an N-channel MOSFET with a charge-induced lightly-doped-drain extension is illustrated in the device cross-sections shown in FIGS. 5a through 5f. Though the fabrication is shown for a single device only, the process as described is compatible with integrated circuits having both N and P channel transistors.

In the process described, the starting material shown in FIG. 5a is P-type silicon substrate 199 having a resistivity ranging from 3 to 50 ohm-cm depending on the maximum desired drain-to-substrate breakdown voltage of the device.

Although not shown, one method of forming CMOS circuits in accordance with the teachings of this invention is as follows. To fabricate CMOS circuits, an initial oxide layer is grown on substrate 199, masked using photolithographic techniques and implanted with phosphorous, which is then diffused into substrate 199 to form N well regions in which P channel transistors are then formed. The N channel transistor described is formed in the substrate itself outside of these N well regions and is therefore unaffected by the process steps used to form the N well and the P channel transistors.

As shown in FIG. 5b, silicon substrate 199 is oxidized to form base oxide layer 10 to a thickness of approximately 500Å, and a layer of silicon nitride 11 is formed to a thickness of approximately 1 μm, for example by chemical vapor deposition. Nitride 11 is then patterned using conventional photolithographic techniques and etched so that nitride 11 remains only in the areas where transistors are to be formed. Optional field threshold adjusting dopants are implanted into that portion of substrate 199 not covered by nitride 11, for example in cases where the to-be-formed field oxide is not thick enough to provide high field threshold voltages. Substrate 199 is then oxidized, for example, in a wet or steam environment, to form field oxide 207 to a thickness between approximately 7,000Å to 2 μm. Substrate 199 is not oxidized in areas protected by the remaining silicon nitride 11.

Figure 5C:
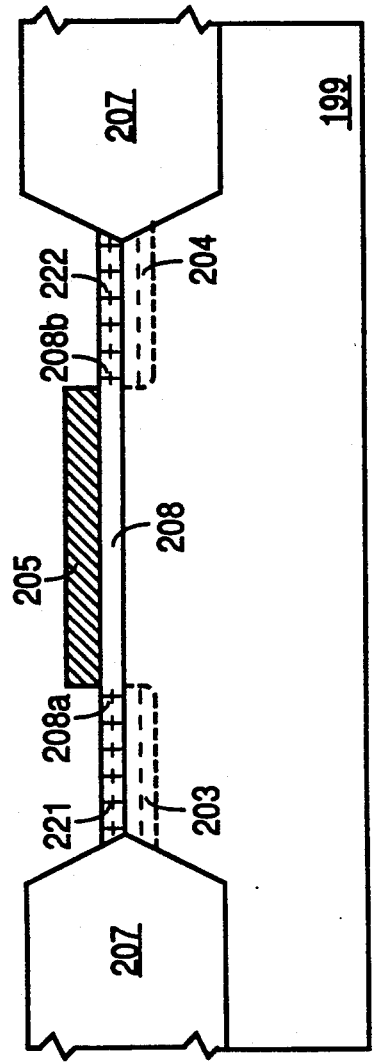

Nitride 11 is then stripped, for example, using a plasma etch, and underlying oxide layer 10 is removed, for example, using HF acid. The thickness of field oxide 207 is not appreciably altered by this operation. As shown in FIG. 5c, gate oxide 208, typically between 300 to 1,500Å thick, is then formed, for example using a high temperature oxidation in a dry or chlorine environment. After gate oxidation, polycrystalline silicon is deposited to a thickness of approximately 7,000Å. An optional N type doping of the polycrystalline silicon, for example, using a high temperature POCl$_3$ predeposition, is performed at this time to increase the conductivity of the polycrystalline silicon layer to between about 15 to 30 ohms/square. The polycrystalline silicon layer is then patterned using conventional photolithographic and etching techniques to form gate electrode 205. In alternative embodiments, refractory metal, one or more layers of refractory metal and polycrystalline silicon, or polycrystalline silicide, are used to form the gate electrode.

Next, those portions of gate oxide layer 208 which are not covered by polycrystalline silicon gate electrode 205 (i.e., portions 208a, 208b) are implanted with positive oxide charges 221, 222, respectively, from group I or group II elements such as cesium, to form induced N type source extension 203 and drain extension 204. The dosage of implanted charges 221, 222 is typically within the range of approximately 1E12 to 1E18 atoms/cm$^2$ depending on the desired concentration of the induced source and drain extensions 203, 204. In CMOS, the P channel source and drain extensions are also created at this time by implanting a negative oxide charge, such as a Group VI or VII element such as iodine or fluorine. However, suitable blocking masks, for example of photoresist, are used to selectively implant positive oxide charges in the N channel devices and negative oxide charges in the P channel devices.

Figure 5D:
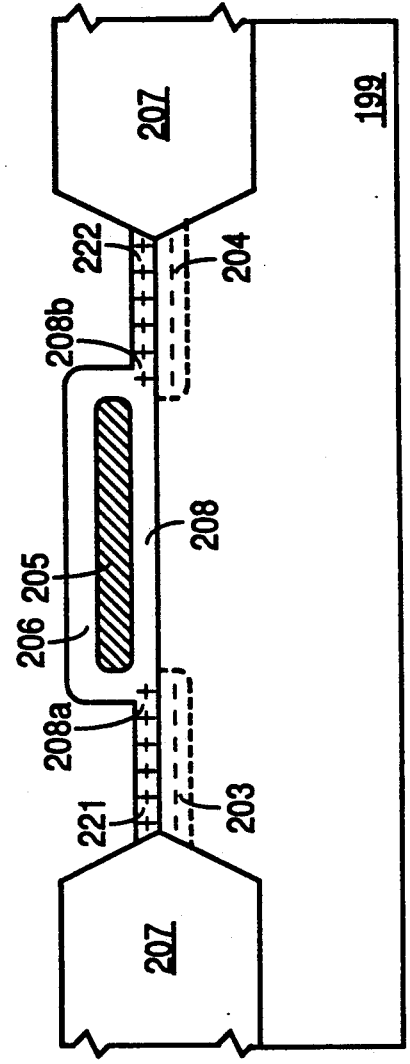

As shown in FIG. 5d, oxide sidewall spacers 206 are formed, in which polycrystalline silicon gate electrode 205 must oxidize faster than any single crystal silicon of substrate 199 which is exposed in the active areas (i.e., other than where covered by oxide or gate electrode 205). As is known in the art, polycrystalline silicon oxidizes more rapidly than silicon, since the grains of the polycrystalline silicon provide a greater surface area for oxidation. A low temperature wet oxidation step can be advantageously employed at this point in the process, taking advantage of the higher stress (grains) of the polycrystalline silicon gate electrode 205. Spacers 206 are typically formed to a width of about 0.5 μm on the sides of gate electrode 205, for example by oxidation of polycrystalline silicon gate electrode 205 at about 800°-900° C. in a wet environment.

Sidewall spacers 206 serve as implant masks to prevent the N+ source and drain implant from self-aligning to polycrystalline silicon gate electrode 205, and advantageously cause the N+source and drain implant to self align to the edges of sidewall spacers 206. The symmetry of the device causes sidewall spacer 206 to be formed on both the source and the drain side of the device, thus causing formation of both a lightly doped source extension 203 and a lightly doped drain extension 204. In many applications, it is known which source/drain region is to function as the drain, and only a drain extension is formed. In these situations where it is known which source/drain region is to be the drain, it is undesirable that sidewall spacer 206 is formed on both the source and the drain side of the device, since this provides an increased source resistance, causing increased negative feedback, and thus a lower transconductance (gm) of the device.

Figure 5E:
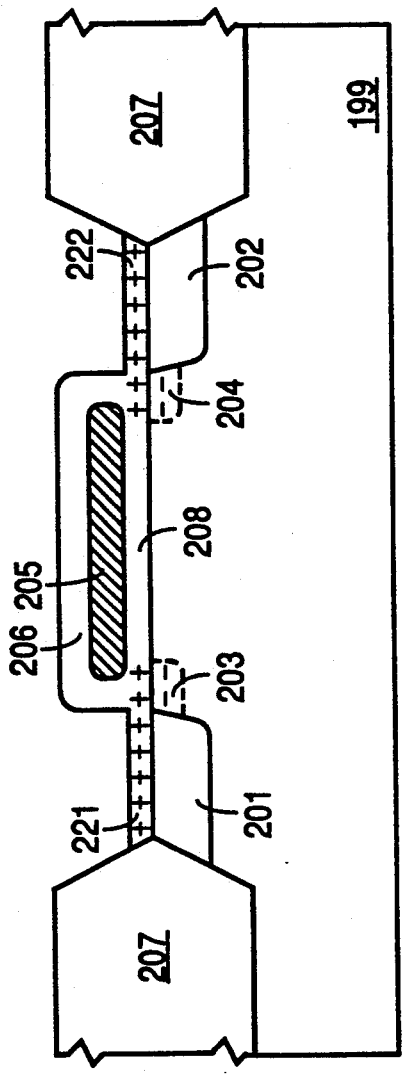

As shown in FIG. 5e, N+ source and drain regions 201 and 202 are now defined using a photoresist implant blocking mask (not shown) and implanted, for example, with As at a dose within the range of about 1E15 to 5E15 cm$^{-2}$ atoms/cm$^2$. The implanted dopants are then diffused, for example, by heating to approximately 900° to 1,100° C. for approximately 20 minutes.

In a CMOS device, source and drain regions of the P channel transistors are now formed in a similar manner, using an N type dopant.

Figure 5F:
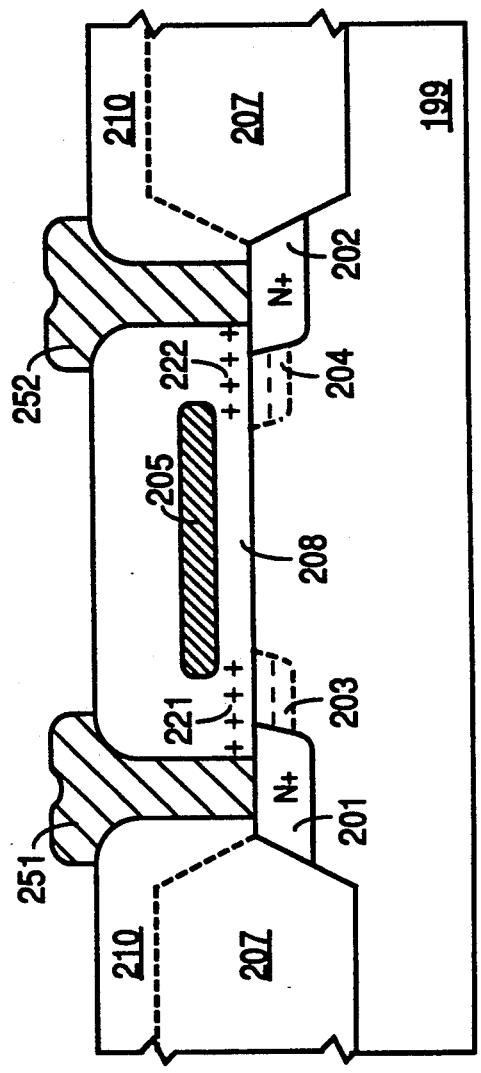

As shown in FIG. 5f, layer 210 of phosphorous doped oxide is then formed, for example by chemical vapor deposition, to a thickness of approximately 1 μm. Using suitable photolithographic and etching techniques, oxide layer 210, as well as underlying portions of gate oxide layer 208, are removed, creating contact openings which allow electrical connection to source region 201 and drain region 202. Oxide layer 210 is then reflowed, for example at about 900° to 1,000° C. A layer of metal such as an alloy of aluminum is then formed and patterned to form source contact 251 and drain contact 252. The remaining metal is then sintered, for example by treating the wafer at approximately 400°–500° C. in the presence of forming gas (a combination of nitrogen and hydrogen gas which does not explode) in order to provide ohmic contact between the metal and the source/drain regions.

Thus, the completed device includes oxide charges 221 and 222 which electrically induce lightly doped source/drain regions 203 and 204.

Figure 6:
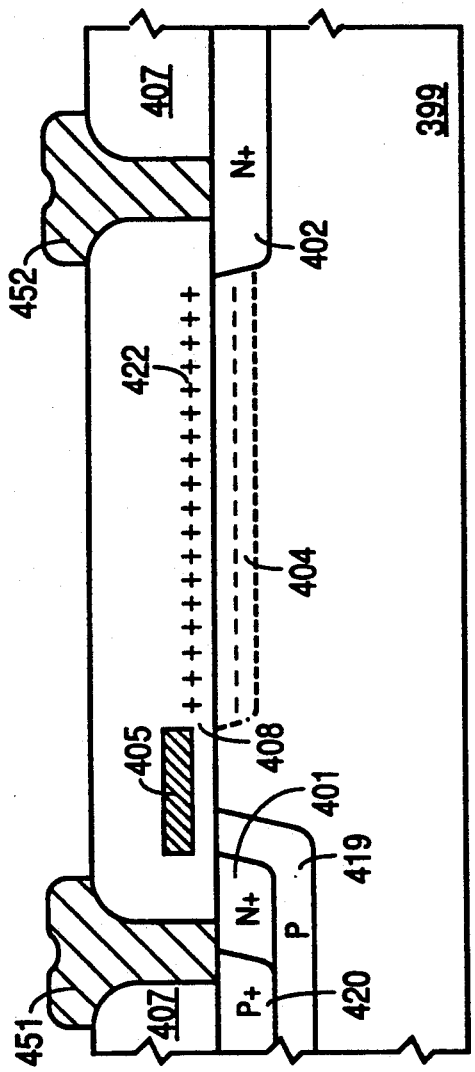
FIG. 6 is a cross-sectional view of an alternative embodiment of a MOSFET device constructed in accordance with the teachings of this invention.

Another transistor constructed in accordance with the teachings of this invention is the embodiment of a high voltage N channel MOSFET shown in the cross sectional view of FIG. 6. MOSFET 400 of FIG. 6 is formed in a similar fashion as MOSFET 200 of FIGS. 4 and 5a–5f, except that the sidewall oxidation step is eliminated, and thus no sidewall spacer is used. Instead of using a sidewall spacer as part of an implant mask, in this embodiment N+source and drain regions 401, 402 are defined by a photoresist implantation blocking mask. P type body diffusion 419 is formed, for example, by body implantation following formation of gate electrode 405 and prior to the formation of source and drain regions 401, 402. The effective depth of drain extension 404 is unaffected by the long diffusion time required to form P type body 419, since the junction between drain extension 404 and substrate 399 is electrically induced. Some redistribution of charge 422 in oxide 408 may result from such a diffusion to form body region 419, thereby resulting in a slight shift in threshold voltage, which is easily compensated for by altering the dosage of charge 422. Such diffusion of charge 422 into substrate 399 results in an inactive dopant; counterdoping of the induced junction does not occur despite the subsequent high temperature processing.

Figure 7:
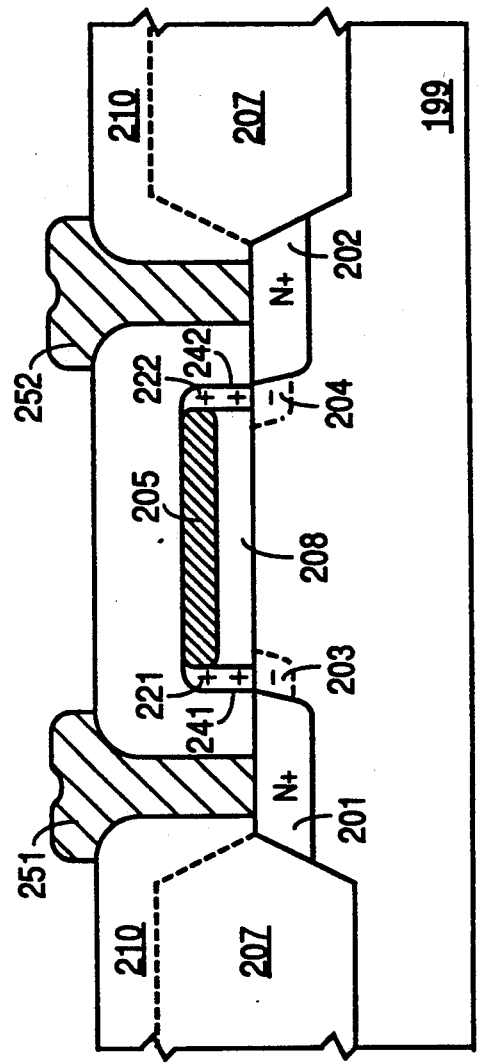
FIG. 7 is a cross-sectional view of an alternative embodiment of a device constructed in accordance with the teachings of this invention in which the charged dopant is contained within sidewall spacers.

FIG. 7 is a cross-sectional view of an alternative embodiment of this invention similar to that of FIG. 5f. As shown on FIG. 7, charged dopants 221 and 222 are conveniently located in one or more sidewall spacers 241 and 242, respectively, formed on the edges of gate electrode 205.

All publications and patent applications are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims.

For example, a sidewall spacer containing charged dopants may be provided on only one edge of the gate electrode, so that an extension region forms on only one side of the channel region. This extension region performs the function of a LDD structure.

What is claimed is:
1. A semiconductor device comprising:
   a first semiconductor region having a first conductivity type;
   a gate dielectric layer formed on the surface of said first semiconductor region;
   a gate electrode formed on said gate dielectric layer;
   a channel region located within said first semiconductor region beneath said gate electrode;
   a source region having a second conductivity type opposite said first conductivity type, located within said first semiconductor region, below and laterally spaced apart form said gate electrode, thereby leaving a first gap between said channel region and said source region;
   a drain region having a second conductivity type opposite said first conductivity type, located within said first semiconductor region, below and laterally spaced apart from said gate electrode, thereby leaving a second gap between said channel region and said drain region;
   a dielectric layer located above said first and second gaps; and
   a charge-contributing element selected from the group of elements consisting of group I, group II, group VI, and group VII elements, said charge-contributing element being stored in said dielectric layer adjacent to said gate electrode and above that portion of said first semiconductor region located adjacent to said gate electrode and above said first and second gaps for providing a charge to the dielectric layer to induce:
      a source extension region located in said first gap within said first semiconductor region and adjacent said channel region, said source extension region being inverted so a to be of a second conductivity type opposite said first conductivity type due to the presence of said charge above said source extension region; and
      a drain extension region located in said second gap within said first semiconductor region and adjacent said channel region, said drain extension region being inverted so as to be of a second conductivity type opposite said first conductivity type due to the presence of said charge above said drain extension region.

2. A semiconductor device as in claim 1 wherein said charge-contributing element is obtained from a dopant selected from the group consisting of cesium fluorine, and iodine.

3. A semiconductor device as in claim 1 wherein said first conductivity type is P, said second conductivity type is N, and said charge is positive.

4. A semiconductor device as in claim 3 wherein said charge is provided by a dopant comprising a group I or group II element.

5. A semiconductor device as in claim 1 wherein said first conductivity type is N, said second conductivity type is P, and said charge is negative.

6. A semiconductor device as in claim 5 wherein said charge is provided by a dopant comprising a group VI or group VII element.

7. A semiconductor device as in claim 1 wherein said dielectric layer comprises said gate dielectric layer.

8. A semiconductor device as in claim 1 wherein said dielectric layer is formed above said gate dielectric layer.

9. A semiconductor device as in claim 1 wherein said dielectric layer comprises a sidewall spacer adjacent to said gate electrode.

10. A semiconductor device as in claim 1 which further comprises a layer of capping material overlying at least those portions of said dielectric layer storing said charge.

11. A semiconductor device comprising:
a first semiconductor region having a first conductivity type;
a gate dielectric layer formed on the surface of said first semiconductor region;
a gate electrode formed on said gate dielectric layer;
a channel region located within said first semiconductor region beneath said gate electrode;
a first source/drain region having a second conductivity type opposite said first conductivity type, located within said first semiconductor region, adjacent to said channel region;
a second soure/drain region having a second conductivity type opposite said first conductivity type, located within said first semiconductor region, below and laterally spaced apart form said gate electrode, thereby leaving a gap between said channel region and said second source/drain region;
a dielectric layer located above said gap; and
a charge-contributing element selected form the group of elements consisting of group I, group II, group VI, and group VII elements, said charge-contributing element being stored in said dielectric layer adjacent to said gate electrode and above said gap for providing a charge to the dielectric layer to induce a source/drain extension region located within said first semiconductor region and within said gap, said source/drain extension being inverted so as to be of a second conductivity type opposite said first conductivity type due to the presence of said charge above said source/drain extension region.

12. A semiconductor device as in claim 11 wherein said charge-contributing element is obtained from a dopant selected from the group consisting of cesium, fluorine, and iodine.

13. A semiconductor device as in claim 11 wherein said first conductivity type is P, said second conductivity type is N, and said charge is positive.

14. A semiconductor device as in claim 13 wherein said charge is provided by a dopant comprising a group I or group II element.

15. A semiconductor device as in claim 11 wherein said first conductivity type is N, said second conductivity type is P, and said charge is negative.

16. A semiconductor device as in claim 15 wherein said charge is provided by a dopant comprising a group VI or group VII element.

17. A semiconductor device as in claim 11 wherein said dielectric layer comprises said gate dielectric layer.

18. A semiconductor device as in claim 11 wherein said dielectric layer is formed above said gate dielectric layer.

19. A semiconductor device as in claim 11 wherein said dielectric layer comprises a sidewall spacer adjacent to said gate electrode.

20. A semiconductor device as in claim 11 which further comprises a layer of capping material overlying at least those portions of said dielectric layer storing said charge.

21. A field effect device comprising:
a semiconductor body of a first conductivity type;
a gate disposed over said semiconductor body so as to enable electrostatic control of conduction of a channel region within said semiconductor body;
a first dielectric member disposed over said semiconductor body and adjacent said gate, and having a charge distributed therein attributable to the presence of a dopant;
a first region of a second conductivity type opposite the first conductivity type disposed in said semiconductor body in proximity to said dielectric member, said first region being integral with an inversion region of a second conductivity type induced by the charge in said first dielectric member and extending to said channel region; and
a second region of the second conductivity type disposed in said semiconductor body in operative association with the channel and said first region.

22. A field effect device as in claim 21, wherein said first region is disposed in said semiconductor body in a self-aligned relationship with respect to said first dielectric member.

23. A field effect device as in claim 22, wherein said first dielectric member is a sidewall spacer, said first region is a drain, and said second region is a source.

24. A field effect device as in claim 21, wherein said first dielectric member is a dielectric layer extending from said gate over said semiconductor body, said first region is a drain, and said second region is a source.

25. A field effect device as in claim 21, further comprising a second dielectric member disposed over said semiconductor body and adjacent a second edge of said gate, said first dielectric member being adjacent a first edge of said gate, wherein:
said second dielectric member has a charge distributed therein attributable to the presence of a dopant; and
said second region is disposed in said semiconductor body in proximity to said second dielectric member, said second region being integral with an inversion region of a second conductivity type induced by the charge in said second dielectric member and extending to said channel region.

26. A field effect device as in claim 25, wherein said first and second dielectric members are respective sidewall spacers, said first region is a drain, and said second region is a source.

27. A field effect device as in claim 21, wherein the gate comprises a gate electrode and a gate dielectric layer, said gate dielectric layer insulating said gate electrode from said semiconductor body and having a portion extending from under said gate toward said first region over said semiconductor body, said first dielectric member comprising the extending portion and the charge in said first dielectric member being distributed in the extending portion.

28. A field effect device as in claim 21, wherein said first dielectric member comprises a sidewall spacer, and wherein the charge in said first dielectric member is distributed in said sidewall spacer.

29. A field effect device as in claim 21, wherein the first conductivity type is P, the second conductivity type is N, and the dopant is a group I or group II element to establish a positive charge in said first dielectric member.

30. A field effect device as in claim 21, wherein the first conductivity type is N, the second conductivity type is P, and the dopant is a group VI or group VII element to establish a negative charge in said first dielectric member.

* * * * *